United States Patent [19]

Dudek et al.

[11] Patent Number: 5,110,384
[45] Date of Patent: May 5, 1992

[54] PROCESS FOR MAKING ELECTRICALLY CONDUCTIVE PATTERNS

[75] Inventors: Dietmar Dudek, Oberursel, Fed. Rep. of Germany; Thomas Pfeiffer, Wilmington, Del.

[73] Assignee: E. I. du Pont de Nemours and Company, Wilmington, Del.

[21] Appl. No.: 510,316

[22] Filed: Apr. 17, 1990

[30] Foreign Application Priority Data

Apr. 21, 1989 [DE] Fed. Rep. of Germany ....... 3913115

[51] Int. Cl.$^5$ .......................... B05D 5/12; C03B 29/00
[52] U.S. Cl. ....................................... 156/89; 156/326; 427/96; 427/123; 427/125; 427/126.2; 427/190; 427/191; 427/193; 427/203; 427/376.1
[58] Field of Search ........................ 156/89, 62.2, 326; 427/96, 208.8, 229, 123, 125, 126.2, 190, 191, 193, 203, 376.1

[56] References Cited

U.S. PATENT DOCUMENTS 3,935,366  1/1976  Smith ................................. 428/328

Primary Examiner—James Lowe
Assistant Examiner—Christopher A. Fiorilla

[57] ABSTRACT

A process for making an electrically conductive pattern on a substrate including forming a patterned adhesive layer on the substrate, applying a conductive metal powder to the adhesive layer, and in a second coating pass, applying a powder containing supplementary elements to the pattern. The patterned substrate is fired to volatilize the adhesive layer and sinter the powders. This process can be used to make printed circuits on ceramic substrates which are useful in hybrid circuits, for example.

9 Claims, No Drawings

PROCESS FOR MAKING ELECTRICALLY CONDUCTIVE PATTERNS

The subject of the invention is a process for making electrically conductive patterns on ceramic substrates, for example, those used as electrical switching circuits in hybrid configurations.

German AS 11 07 743 and Canadian Patent 11 55 967 disclose the production of electrically conductive patterns on surfaces of ceramic substrates by the so-called powder process. In this process, a tacky pattern is produced on the substrate surface, and the surface is then treated with a metal powder. The tacky material can then be removed by thermal treatment, and the metal powder can be sintered to a continuous pattern of conductor lines.

Besides the actual conductive metal from which the conductor lines are formed, it is generally necessary to add supplementary elements, optionally in the form of suitable compounds, to make the patterned metal layer adhere to the substrate after sintering, and to control the sintering to produce conductor lines with a smooth surface and uniform cross-section. Adhesion is developed by two different mechanisms. In glass bonding, the oxides of the supplementary elements form a glass that melts at the firing temperature and after cooling, bonds the substrate with the conductor lines partly by adhesion and partly by surface interlock. In reactive or oxide bonding, an intermediate bonding phase is formed by the solid state reaction of these oxides with the substrate and the conductive metal. The selection of the supplementary elements is oriented correspondingly to the type of conductive metal and the type of substrate. Suitable combinations are known from thick film technology. For example, German Patent 25 43 922 cites compounds mediating adhesion of gold and silver on aluminum oxide, beryllium oxide and sapphire; these compounds contain cadmium, copper, lead, titanium, zirconium, silicon, boron and alkali metals. Compounds of rhodium, bismuth and silver are also known to modify decorative gold coatings on ceramic substrates so that sintering results in uniform layers with good adhesion and a glossy surface (for example, see Ullmann's "Enzyklopaedie der technischen Chemie" ("Encyclopedia of Industrial Chemistry") 4th edition, Volume 14, page 10).

The activity of the supplementary elements is thought to occur principally at the interface between the substrate and the conductive metal, or at the surface of the conductive metal, respectively. It is generally disadvantageous whenever the supplementary metal penetrates the conductive metal and forms mixtures with it, because this reduces the specific conductivity of the conductor line.

German Patent Specification 38 06 515 describes a process by which metal powders for the powder process can be produced. These powders contain a homogeneous distribution of suitable compounds of the requisite supplementary elements. Fine conductor lines of good quality and conductivity can indeed be prepared by the use of these powders. However, the process for making the powders is relatively complex. A further disadvantage is that different powders must be made and stocked for different substrates and according to the desired quality of the conductor lines.

Therefore, the invention involves the problem of developing a process by which the supplementary elements required for controlling adhesion and the sintering phase in making electrically conductive patterns on ceramic substrates by the powder process are introduced into the system in a simple manner, so that they do not adversely affect the conductivity of the conductive metal.

The invention is directed to a process for making an electrically conductive pattern on a substrate comprising:

(a) forming on the substrate a patterned adhesive layer that is at least temporarily tacky;

(b) applying a powder comprising metal to the patterned adhesive layer;

(c) applying to the metal-containing powder pattern a second powder comprising a supplementary element or a mixture of supplementary elements wherein the supplementary elements are selected from the group consisting of bismuth, cadmium, lead, copper, boron, rhodium, nickel, indium, aluminum, and silicon; and (d) firing the patterned substrate at a temperature and time sufficient to remove the adhesive layer and sinter the powders.

To produce the pattern, which is at least temporarily tacky, on the substrate, a suitable adhesive, for example, is applied by screen printing on the substrate surface. However, for greater resolution and hence significantly finer metallic patterns, it is preferable to use a light-sensitive layer with a tackiness that changes on exposure. Suitable compounds are described in the German Patents 12 10 321, 19 04 059, 19 44 311, 27 28 209, 28 15 894, 30 23 247, 34 29 615 and others. The 1,4-dihydropyridine compounds of German Patent 34 29 615 are especially preferred as light-sensitive layer components.

German Patent 35 40 804 discloses that powder patterns of luminescent pigments, patterns that were made by using light-sensitive 1,4-dihydropyridine compounds, can be contaminated by treatment with a second powder. The explanation given is that coating with the first pigment does not fully saturate the tacky surface. However, this is not likely for powder patterns made with metal-containing powders. In this case, because the powder patterns have to be sintered to compact conductor lines of sufficient thickness and conductivity, the coating weights per unit of area are so high that the tacky surface is covered by at least one compact layer of powder particles.

Under these circumstances, particles of a second powder adhere not to the unsaturated tacky layer, but rather perhaps to the outer surface of the metal-containing powder layer. How this adhesion occurs cannot be explained in detail. It is possible that during the first coating, some particles of the metal-containing powder do not immediately adhere firmly, pick up some tacky material on their surface, and finally remain fixed on the exterior of the powder pattern with tacky surfaces facing outward. In a second coating pass, particles of the second powder can then adhere to these particles. It is conceivable, however, that tacky material migrates out of the light-sensitive layer by diffusion over the surface of the particles of the first powder pattern to the outer side of the powder layer, thus making adhesion of the second powder possible.

In performing the process of the invention, it is generally observed that the amount of the second powder deposited on the first powder pattern by the second coating is determined not only by conditions during the second coating, but also by those during the first coating and by the time elapsing between the two procedures. The requisite parameters for the desired coating can be established by pre-testing. Generally, the second powder is coated at a rate in the range of 0.1-25 weight percent of the conductor line (first powder) weight per area. Preferably, the range is about 1-10 weight percent.

One skilled in the art would expect that compounds of the supplementary elements, if they are to ensure adhesion of the conductor lines, must be applied between conductor line and substrate. Surprisingly, however, the invention shows that adhesion of the sintered conductor line to the substrate can also be assured by applying adhesion-mediating compounds on the exterior of the powder layer.

Powders for making the first powder pattern consist preferably of conductive metals, with no additives. Gold, silver, platinum, palladium, copper and their alloys are preferred conductive metals. A mixture of several metal powders may also be used to make the powder pattern.

The selection of supplementary elements is governed by the type of metals used to make the metallic patterns and by the type of substrate. For this purpose, one skilled in the art can draw on the state of the art.

Supplementary elements used in the second powder to control adhesion and sintering can be, for example, bismuth, cadmium, lead, rhodium, copper, nickel, boron, aluminum and/or silicon. Thus, adhesion can occur by both the mechanism of oxide bonding and that of glass bonding.

The second powder can contain the supplementary elements both in the pure state and as salts or oxides. If the conductive metal is a noble metal, the powder pattern can be sintered in an oxidizing atmosphere; the supplementary elements introduced in the pure state are thus converted into adhesion-mediating oxides. In this version of the process, metallic bismuth, cadmium, lead, boron and rhodium are especially suitable. However, these elements can also be used in the form of oxides or salts as components of the second powder.

Finally, a glass powder containing, for example, oxides of silicon, lead, aluminum and/or boron may be used as the second powder.

Shaped aluminum oxide structures of the current state of the art are preferred as heat-resistant substrates. However, other known substrates, for example, of beryllium oxide, aluminum nitride, silicon dioxide or enameled metal can be used.

The ceramic substrates with the powder patterns resulting from applying powders to the tacky surface areas are fired in the usual manner. In this step, the layers that are at least temporarily tacky are removed by vaporization or oxidation, and simultaneously, the powder patterns are sintered to the desired conductor line circuits.

Conductor line patterns made by the process of the invention have a very low foreign metal content, and hence, their specific conductivity approaches very closely that of pure compacted metals. Since they are easy to make in greater thicknesses than thin film patterns, their conductivity is superior to the latter. They have a glossy surface, very uniform line edges, and, even at widths below 20 microns, no breaks. Because they adhere very strongly and uniformly to the substrate, adhesion defect frequency is drastically reduced.

The supplementary elements needed to control sintering and adhesion can be completely contained in the second powder. Hence, pure metal powders that have not undergone any special pretreatment may be used for toning the tacky patterns. Because such powders are commercially available, the process is greatly simplified versus the state of the art. In this case, a further advantage is that the toner powder composition remains constant during use, because it has no components that might adhere selectively to the tacky surface.

The invention is used for making conductor line patterns on ceramic substrates, for example, for hybrid circuits. It may also be used for other purposes, for example, metallic decorations.

EXAMPLE

A solution of 3.25 grams each of the dimethyl and the diethyl ester of 2,6-dimethyl-4-(2'-nitrophenyl)-1,4-dihydropyridine-3,5-dicarboxylic acid in 100 ml of methyl ethyl ketone was coated on 5×5 cm test plates of aluminum oxide and dried. The dried light-sensitive layer was about 1.5 microns thick. On this layer, a test pattern with conductor lines 25 microns wide and rectangular areas of 2×2 mm was exposed with a mercury vapor lamp for the bonding test. A powder pattern with a coating weight of about 8 mg/cm was produced on the exposed layer by using pure gold powder with an average particle size of about 1.5 microns, in accordance with the process of German Patent 37 36 391. After a waiting period of 5 minutes at room temperature, the following powders were applied in a second coating step:

Sample 1: pure bismuth metal with an average particle size of 10 microns; 0.8 mg/cm remained adhered on the first powder pattern.

Sample 2: finely milled bismuth (III) nitrate. Coating weight 0.7 mg/cm.

Sample 3: a mixture of equal parts by weight of bismuth (III) nitrate and lead (II) acetate. Coating weight 0.6 mg/cm.

Sample 4: glass powder composition (percent by weight): 17.9% silicon dioxide, 72.1% lead oxide, 2.8% aluminum oxide, 1.2% boron oxide, coating weight 0.2 mg/cm.

The plates were then fired for 10 minutes at 900° C. Microscopic investigation showed conductor lines with even edges and smooth surfaces.

Adhesion of the gold layer to the substrate was determined by bonding 37.5 μm thick gold wires to the 2×2 mm areas and measuring the force required to detach them. This test was repeated about one hundred times, and the average peel strength was determined. To determine the specific resistance of the conductor lines, their cross-section was calculated from the amount of coated powder determined by weight. The test results are shown in the table below.

Comparison Test

In this test, the tacky patterns were treated with a powder made from 104 mg of bismuth (III) acetate and 5 grams of gold powder, using the procedure described in Example 2 of German Patent Application 38 06 515. A second powder was not used. In other respects, the procedure was the same as in the example.

| Sample | Peel Strength | Specific Resistance (uΩcm) |
| --- | --- | --- |
| 1 | 15.8 | 2.8 |
| 2 | 13.8 | 2.6 |
| 3 | 14.7 | 2.6 |

| Sample | Peel Strength | Specific Resistance (uΩcm) |
| --- | --- | --- |
| 4 | 16.3 | 2.6 |
| Comparison | 16.7 | 2.8 |

The example demonstrates that results of the same quality as those obtained using the state of the art can be achieved by the much simpler process of the invention. The special preparation of the gold powder required in the prior art is more complicated than the application of pure metal powders in the invention.

We claim:

1. A process for making an electrically conductive pattern on a substrate comprising:
   (a) forming on the substrate a patterned adhesive layer that is at least temporarily tacky;
   (b) applying a powder comprising metal to the patterned adhesive layer;
   (c) applying to the metal-containing powder pattern a second powder comprising a supplementary element or a mixture of supplementary elements wherein the supplementary elements are selected from the group consisting of bismuth, cadmium, lead, copper, boron, rhodium, nickel, indium, aluminum, and silicon; and
   (d) firing the patterned substrate at a temperature and time sufficient to remove the adhesive layer and sinter the powders.

2. The process of claim 1, characterized in that the layer that is at least temporarily tacky is a light-sensitive layer that changes in tackiness on exposure to light.

3. The process of claim 2, characterized in that the light-sensitive layer contains 1,4-dihydropyridine compounds.

4. The process of claim 1, characterized in that the metal-containing powder contains no supplementary elements.

5. The process of claim 4, characterized in that the metal is a conductive metal selected from the group consisting of pure gold, silver, platinum, palladium, and copper and mixtures and alloys thereof.

6. The process of claim 5, characterized in that the supplementary element(s) in the second powder is/are selected from the group consisting of bismuth, cadmium, lead, rhodium, copper, nickel, boron, aluminum, and silicon.

7. The process of claim 6, characterized in that the second powder consists of metallic bismuth, cadmium, lead, boron, and/or rhodium.

8. The process of claim 6, characterized in that the second powder contains oxides or salts of bismuth, cadmium, lead, boron, and/or rhodium.

9. Process as in claim 6, characterized in that the second powder is a glass powder containing oxides of silicon, lead, aluminum, and/or boron.

* * * * *